US009224575B2

(12) United States Patent
Yamamoto et al.

(10) Patent No.: US 9,224,575 B2
(45) Date of Patent: Dec. 29, 2015

(54) CHARGED PARTICLE BEAM DEVICE AND OVERLAY MISALIGNMENT MEASUREMENT METHOD

(71) Applicant: Hitachi High-Technologies Corporation, Minato-ku, Tokyo (JP)

(72) Inventors: Takuma Yamamoto, Tokyo (JP); Tomohiro Funakoshi, Tokyo (JP); Kenji Tanimoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/435,203

(22) PCT Filed: Oct. 23, 2013

(86) PCT No.: PCT/JP2013/078678
§ 371 (c)(1),
(2) Date: Apr. 13, 2015

(87) PCT Pub. No.: WO2014/065311
PCT Pub. Date: May 1, 2014

(65) Prior Publication Data
US 2015/0287569 A1     Oct. 8, 2015

(30) Foreign Application Priority Data

Oct. 26, 2012    (JP) ................................. 2012-236901

(51) Int. Cl.
*H01J 37/22*     (2006.01)
*G01B 15/00*     (2006.01)
*H01J 37/28*     (2006.01)

(52) U.S. Cl.
CPC ............... *H01J 37/222* (2013.01); *G01B 15/00* (2013.01); *H01J 37/28* (2013.01); *H01J 2237/2817* (2013.01)

(58) Field of Classification Search
USPC ......................................... 250/306, 307, 310
See application file for complete search history.

(56) References Cited

U.S. PATENT DOCUMENTS 5,608,218 A     3/1997    Sato et al.
2004/0066517 A1*   4/2004    Huang et al. .................. 356/509
(Continued)

FOREIGN PATENT DOCUMENTS

JP        6-243814 A     9/1994
JP        3291880 B2     6/2002
(Continued)

OTHER PUBLICATIONS

International Search Report (PCT/ISA/210) dated Nov. 19, 2013, with English translation (two (2) pages).

*Primary Examiner* — Kiet T Nguyen
(74) *Attorney, Agent, or Firm* — Crowell & Moring LLP

(57) ABSTRACT

An overlay misalignment amount of patterns on different layers can be accurately measured. To achieve this, a charged particle beam device includes: a charged particle beam source irradiating a sample with a charged particle beam under one irradiation condition; a first detector that detects a signal generated front a first pattern formed on a first layer in an irradiation region; a second detector that detects a signal generated from a second pattern formed on a second layer in the irradiation region at a same time as the first detector; and an image processing unit that calculates an overlay misalignment amount between the first pattern and the second pattern based on a first detection signal and a second detection signal output by the first detector and the second detector, respectively.

16 Claims, 11 Drawing Sheets

(56) References Cited

U.S. PATENT DOCUMENTS

| | | |
|---|---|---|
| 2008/0224035 A1 | 9/2008 | Sutani et al. |
| 2011/0139982 A1 | 6/2011 | Kijima et al. |
| 2011/0268363 A1* | 11/2011 | Osaki et al. .................. 382/209 |
| 2012/0274757 A1 | 11/2012 | Bai et al. |
| 2012/0305767 A1 | 12/2012 | Toyoda et al. |
| 2015/0136976 A1* | 5/2015 | Matsuoka .................... 250/306 |

FOREIGN PATENT DOCUMENTS

| | | |
|---|---|---|
| JP | 2006-286685 A | 10/2006 |
| JP | 2007-42929 A | 2/2007 |
| JP | 2008-58166 A | 3/2008 |
| JP | 2010-85138 A | 4/2010 |
| JP | 2011-119446 A | 6/2011 |
| WO | WO 2011/099490 A1 | 8/2011 |

* cited by examiner

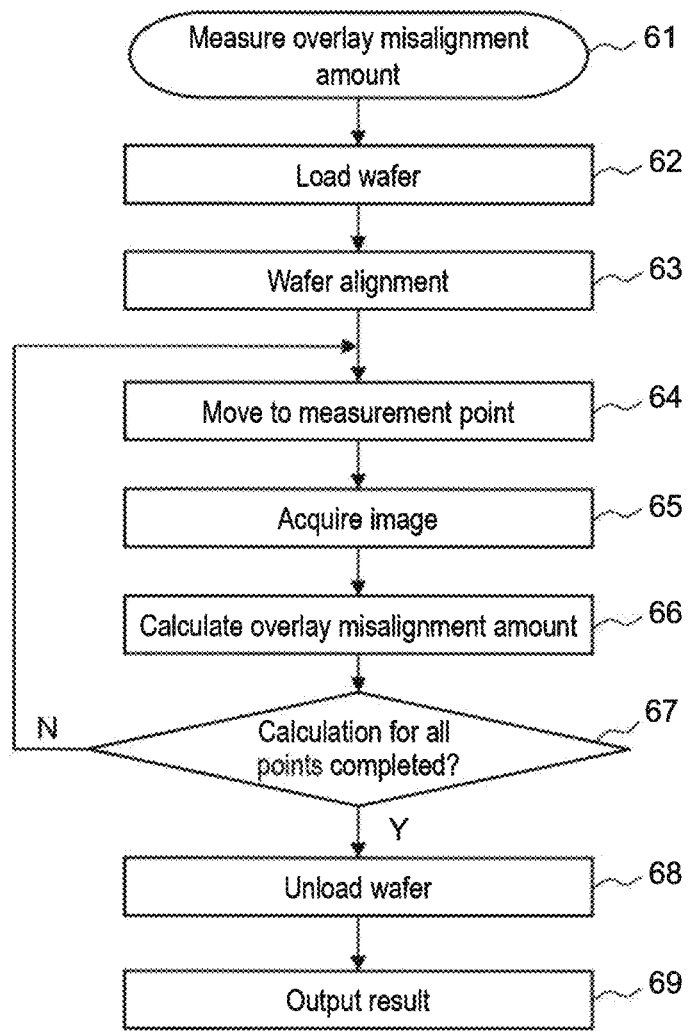

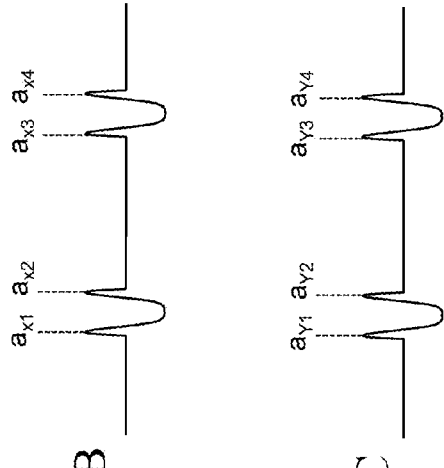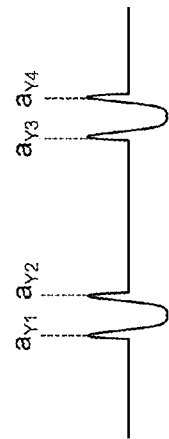
Fig. 8B
Fig. 8C
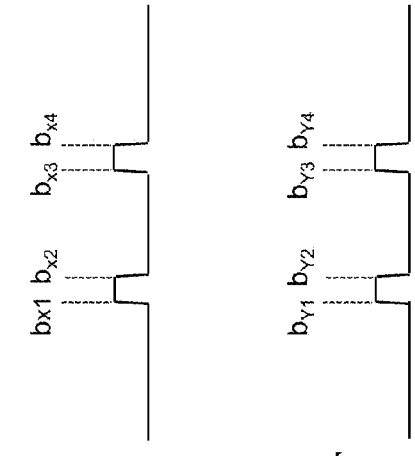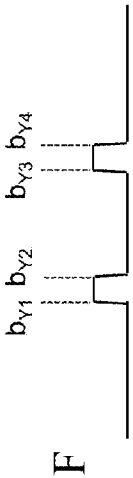
Fig. 8E
Fig. 8F
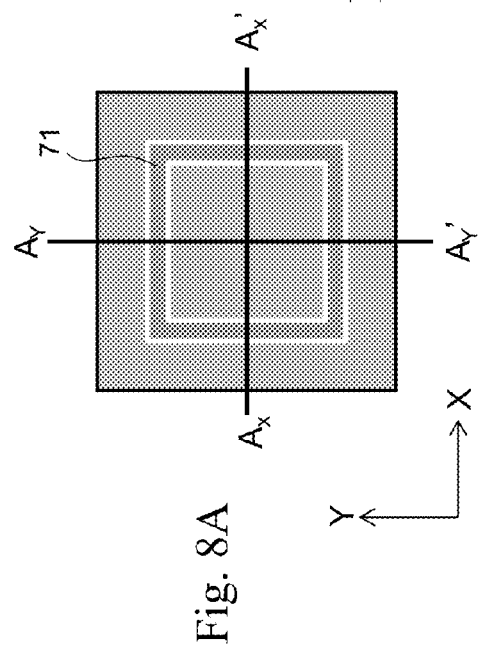
Fig. 8A
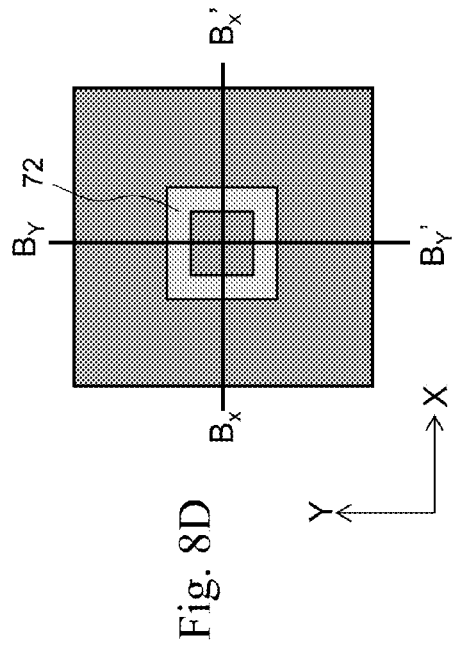
Fig. 8D

CHARGED PARTICLE BEAM DEVICE AND OVERLAY MISALIGNMENT MEASUREMENT METHOD

TECHNICAL FIELD

The present invention relates to a technique to measure an overlay misalignment amount of patterns, e.g., in steps for manufacturing a semiconductor device.

BACKGROUND ART

Descriptions will be given of problems of an examination technique for a case of manufacturing a semiconductor device on a semiconductor wafer. A semiconductor device is manufactured by repeating a step to transfer a pattern formed on a photo mask onto a semiconductor wafer by a lithographic processing and an etching processing. In the process for manufacturing a semiconductor device, the quality of, e.g., a lithographic processing and an etching processing and the occurrence of a foreign substance have a significant influence on a yield of the semiconductor device. Thus, early or previous detection of an abnormality or a defect in the manufacture processing is important. Accordingly, in the manufacture process, a pattern formed on a semiconductor wafer is measured and examined.

Particularly, due to recent development of miniaturizing and three-dimensionally forming a semiconductor device, managing overlaying patterns in different processes becomes more important. Conventionally, in order to determine an overlay misalignment amount of patterns between different process steps, a semiconductor device is irradiated with a light and a position of a pattern manufactured in each step is measured based on a reflected light from the semiconductor device.

However, due to miniaturizing of a pattern, a light hardly obtains a required accuracy. Needs for measurement of an overlay misalignment amount with use of a scanning electron microscope, which has a higher resolution than a light, are increasing. For example, Patent Literature 1 proposes a method for measuring a misalignment amount between two patterns formed by double patterning with a scanning electron microscope. In Patent Literature 1, two patterns formed on a surface of a semiconductor device are measured. Thus, a scanning electron microscope can easily acquire images of those patterns.

On the other hand, to measure an overlay misalignment amount between a pattern formed on a surface of a semiconductor device and a pattern formed inside the semiconductor device, respective favorable images of the surface pattern and the inside pattern are required to be obtained. Generally, while a secondary electron from a sample includes much information of the surface, information of the inside structure is mainly reflected in a back scattered electron. Patent Literature 2, for example, describes a scanning electron microscope capable of detecting a secondary electron and a back scattered electron, separately. Patent Literature 3 discloses a technique to improve a contrast of a lower layer pattern with use of detection signals from multiple detectors. Patent Literature 4 discloses a technique for acquiring pattern images of different layers with two light sources having different irradiation energies and displaying the pattern images alternatively or substantially in an overlaid manner.

CITATION LIST

Patent Literature

Patent Literature 1
  JP Patent Publication (Kokai) No. 2010-85138
Patent Literature 2
  JP Patent No. 3291880
Patent Literature 3
  JP Patent Publication (Kokai) No. 2011-119446
Patent Literature 4
  JP Patent Publication (Kokai) No. 6-243814 (1994)
Patent Literature 5
  JP Patent Publication (Kokai) No. 2007-42929

SUMMARY OF INVENTION

Technical Problem

However, measurement of an overlay misalignment amount of a surface pattern (upper layer pattern) and an inside pattern (lower layer pattern) by the conventional technique has the following problems.

As described above, much information of a surface pattern is included in a secondary electron, while much information of an internal pattern is included in a back scattered electron. However, appearance of a pattern contrast or pattern edge of a secondary electron is significantly different from that of a back scattered electron. Thus, calculation of pattern positions by same algorithm is impossible.

If an incident direction of an electron beam inclines with respect to a sample surface (if the electron beam is not perpendicularly incident on the sample surface), the inclination may cause a measurement error between a pattern position of a surface and a pattern position of an inside.

A method for acquiring a surface pattern and an inside pattern with two electron guns (Patent Literature 4) requires previous coincidence of two electron beam axes. The method has an object of allowing observation of the surface pattern and the inside pattern on a screen. In the method, calculation of a value of an overlay misalignment amount is not considered.

The present invention has been made by considering the aforementioned technical problems. The present invention provides a technique to measure accurately a value of an overlay misalignment amount between patterns formed on different layers.

Solution to Problem

The present invention includes: a charged particle beam source that irradiates a sample with a charged particle beam under one irradiation condition; a first detector that detects a signal generated from a first pattern formed on a first layer in an irradiation region; a second detector that detects a signal generated from a second pattern formed on a second layer in the irradiation region at a same time as the first detector; and an image processing unit that calculates an overlay misalignment amount between the first pattern and the second pattern based on a first detection signal and a second detection signal output by the first detector and the second detector, respectively.

Advantageous Effects of Invention

The present invention allows accurate measurement of an overlay misalignment amount of patterns formed on different layers. Feedback of the measurement result to a manufacturing process contributes to improvement in yield of a semiconductor device. Problems, configurations and effects other than those described above are clear from the following descriptions of embodiments.

BRIEF DESCRIPTION OF DRAWINGS

FIG. 6 is a diagram of a procedure for measuring an overlay misalignment amount of Embodiment 1.

FIGS. 8A-8F are diagrams explaining a method for measuring an overlay misalignment amount.

DESCRIPTION OF EMBODIMENTS

Hereunder, descriptions will be given of embodiments of the present invention in accordance with the drawings. The embodiments of the present invention are not limited to the following examples, and various modifications can be made within the scope of the technical idea of the embodiments.

Embodiment 1

Configuration of Device

Figure 1:
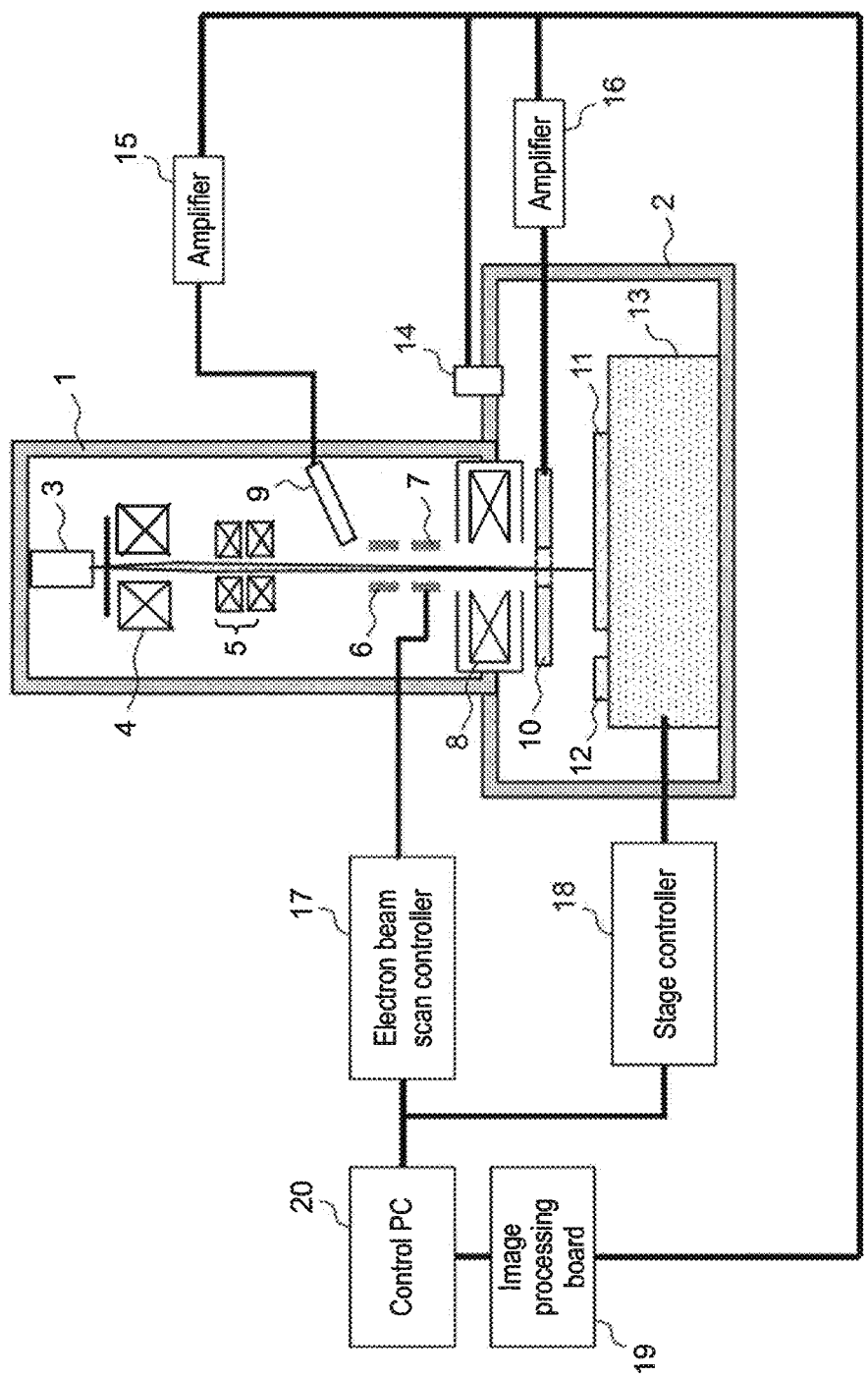
FIG. 1 is a diagram illustrating a schematic configuration of a scanning electron microscope of Embodiment 1.

FIG. 1 illustrates a configuration of a device of a scanning electron microscope of the present embodiment. A device body of the scanning electron microscope is formed of a column 1 and a sample chamber 2.

The column 1 includes therein an electron gun 3 that generates irradiation electrons, a condenser lens 4 and an objective lens 8 that converge the irradiation electrons to irradiate a wafer 11, a deflector 7 that scans the irradiation electrons over the wafer 11, an aligner 5 that aligns the irradiation electrons with respect to the objective lens 8, a secondary electron detector 9 that detects secondary electrons generated from the wafer 11, an ExB filter 6 that is used for capture of the secondary electrons into the secondary electron detector 9, and a back scattered electron detector 10 that detects back scattered electrons from the wafer 11. The deflector 7 scans irradiation electrons over the wafer 11 in accordance with a signal provided by an electron beam scan controller 17.

An XY stage 13 set in the sample chamber 2 moves the wafer 11 with respect to the column 1 in accordance with a signal provided by a stage controller 18. On the XY stage 13, a standard sample 12 to be used for correction of an incident angle of an irradiation electron is placed. The device further includes an optical microscope 14 for wafer alignment.

Detection signals output by the secondary electron detector 9 and the back scattered electron detector 10 are subject to signal conversion by amplifiers 15 and 16, and are provided to an image processing board 19. The image processing board 19 adds signals provided by the secondary electron detector 9 and the back scattered electron detector 10 to convert the signals to an image. A detection signal from the secondary electron detector 9 indicates mainly pattern information of a wafer surface (upper layer). A detection signal from the back scattered electron detector 10 indicates mainly pattern information of a lower layer. The image processing board 19 calculates a numerical value of overlay difference of patterns from the pattern image generated based on the two detection signals. A control PC 20 controls entire operation of the scanning electron microscope. The control PC 20 is connected to a monitor or an input device (not illustrated). A GUI, which will be described later, is displayed on the non-illustrated monitor.

[Principle of Occurrence of Measurement Difference]

Figure 2:
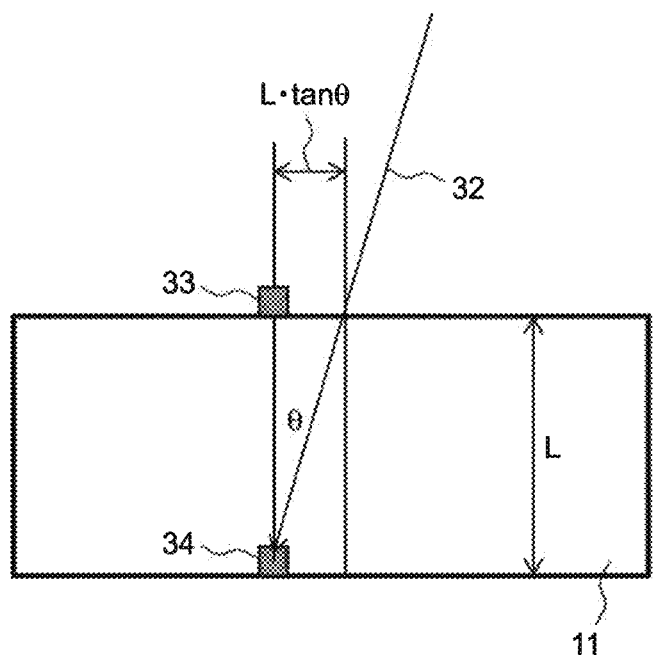
FIG. 2 is a diagram explaining a cause of measurement misalignment between patterns overlaid on different layers.

FIG. 2 provides an explanation of a cause of difference included in an overlay measurement value of patterns formed on different layers, in a case where an irradiation electron 32 is incident on a sample surface obliquely from above (where the irradiation electron 32 is deviated from a perpendicular of the sample surface by angle θ).

In FIG. 2, a pattern 33 and a pattern 34 are formed at a same position of two layers a height difference between which is a thickness L of the sample 11. In this case, a misalignment amount between the pattern 33 and the pattern 34 should be measured as zero. However, inclination of the irradiation electron 32 by the angle θ provides a measurement result in which respective positions of the patterns 33 and 34 are deviated from each other by L·tan θ. Thus, before measurement of an overlay misalignment amount of patterns formed on different layers, correction is required to cause the irradiation electron 32 to be incident perpendicularly on the wafer 11.

[Adjustment of Irradiation Angle]

Figure 3:
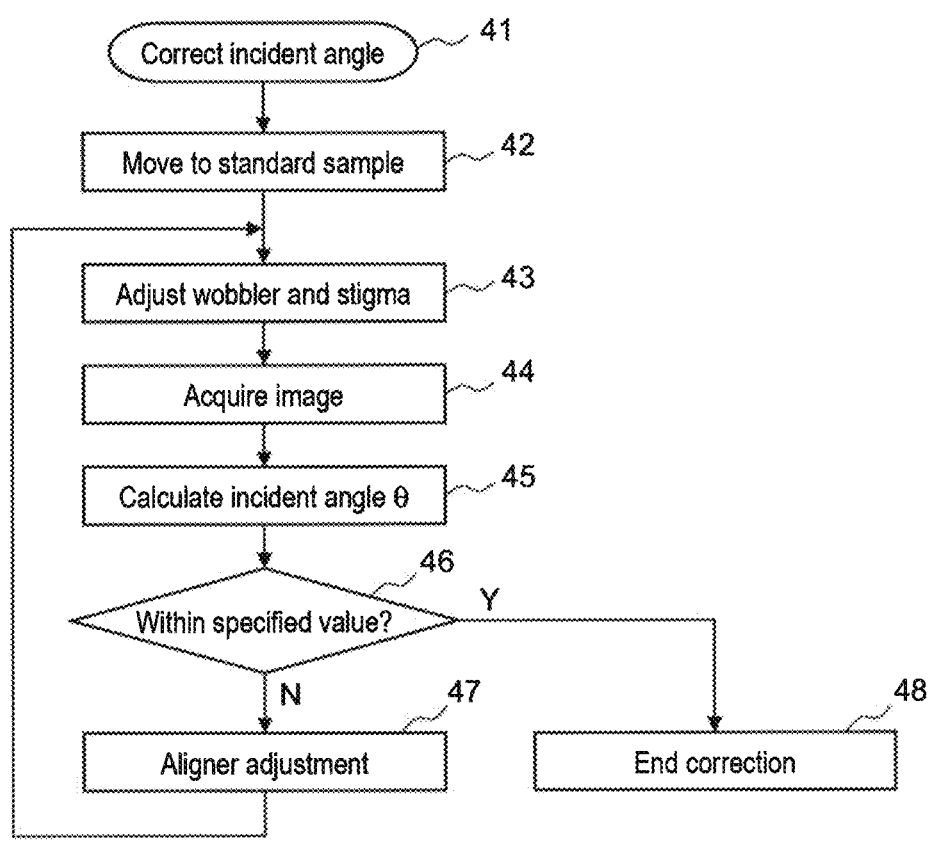
FIG. 3 is a diagram illustrating a procedure for correcting an incident angle of an irradiation electron.

FIG. 3 illustrates a procedure for correcting an inclination of an irradiation electron. 32 (irradiation angle θ). When correcting operation of the irradiation angle of the irradiation electron 32 is selected on the GUI screen on the monitor, operation illustrated in FIG. 3 starts (process 41). After start of the correcting operation, the control PC 20 controls movement of the XY stage 13 and moves the standard sample 12 to an irradiation region of the irradiation electron 32 (process 42). On the standard sample 12, patterns are formed at a same position on two layers without misalignment, or two patterns on different layers having a known pattern position relationship.

At this stage, a wobbler and a stigma are adjusted (process 43). Subsequently, the control PC 20 acquires an image of the standard sample 12 (process 44). More specifically, the control PC 20 acquires a secondary electron image corresponding to a top layer pattern of the standard sample 12 and a back scattered electron image corresponding to a second layer pattern from the top.

Next, the image processing board 19 calculates the incident angle (inclination) θ of the irradiation electron 32 (process 45). More specifically, the image processing board 19 calculates a pattern position on the upper layer and a pattern position on the lower layer based on a detected image, calculates the difference L·tan θ between the two pattern positions, and calculates the incident angle θ with the difference and the known thickness L.

Next, the image processing board 19 compares the calculated incident angle θ with a specified value (allowable value) (process 46).

If the incident angle θ is larger than the specified value, the control PC 20 adjusts the inclination of the irradiation electron 32 with the aligner 5 (process 47). The control PC 20 subsequently returns the process to process 43. In this way, with respect to adjusted incident angle θ, adjustment of the wobbler and a stigma, acquisition of the image and calculation processing of the incident angle (inclination) θ are executed. The aligner 5 is formed of two sets of alignment coils that are disposed above and below the column 1. The aligner 5 can change only the inclination of an electron beam while fixing the irradiation position of the irradiation electron 32 on the sample.

If the calculated incident angle θ is within the specified value, the control PC 20 ends the correction processing of the incident angle θ (process 48).

[Method of Calculating Incident Angle θ]

Figure 4A:
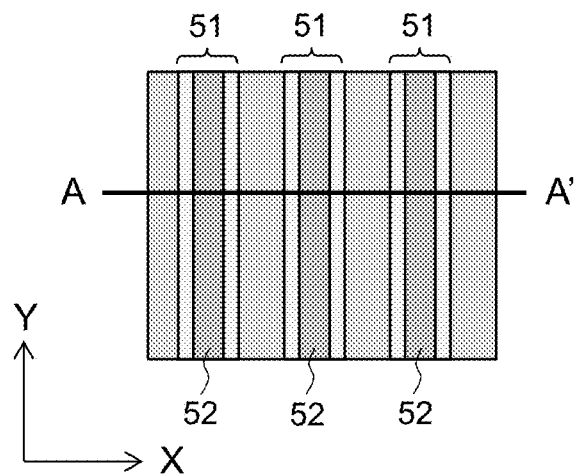
FIGS. 4A and 4B are diagrams of a structure example of a standard sample.
Figure 4B:
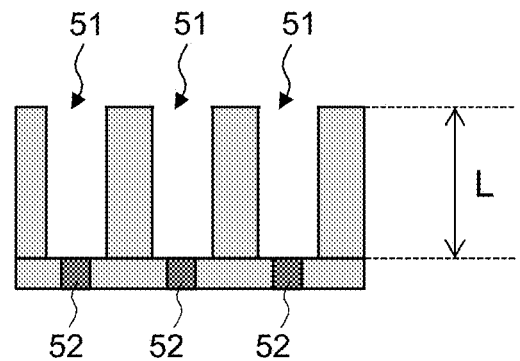

A processing procedure for calculating the incident angle θ of the irradiation electron 32 will be described with reference to FIG. 4 and FIG. 5. FIG. 4 is a schematic diagram to explain a pattern shape formed on the standard sample 12. FIG. 4(*a*) is a diagram (plane view) of the standard sample 12 viewed from an incident direction of the irradiation electron 32. FIG. 4(*b*) is a schematic diagram (cross-sectional view) of a section taken along line A-A' in FIG. 4(*a*). As illustrated in FIG. 4(*b*), a groove 51 with a depth L is formed on the surface of the standard sample 12. A bottom surface of the groove 51 has a line pattern 52 formed thereon. The center of the groove 51 aligns with the center of the line pattern 52. No misalignment between the centers is confirmed through observation of the section of the same lot.

Figure 5A:
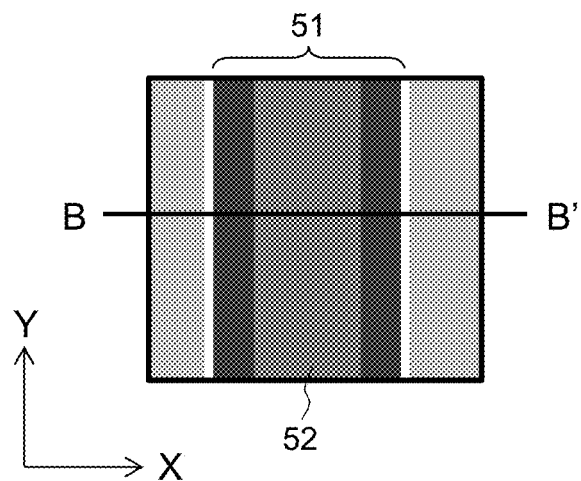
FIGS. 5A and 5B are diagrams explaining a method of correcting an incident angle with a standard sample.
Figure 5B:
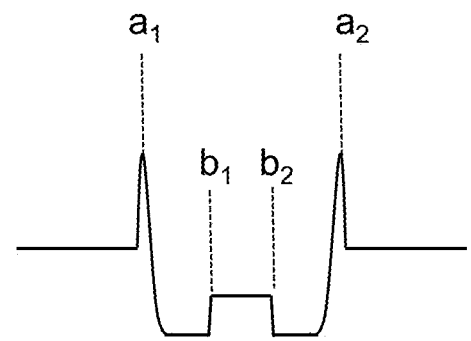

FIG. 5 illustrates an SEM image of the standard sample 12. The SEM image in FIG. 5(*a*) is obtained by adding a signal from the secondary electron detector 9 and a signal from the back scattered electron detector 10. FIG. 5(*b*) illustrates a signal strength in the section B-B'. In FIG. 5(*b*), a1 and a2 are peaks of a signal Obtained for the edge of the groove 51. The section b1-b2 corresponds to the line pattern 52 on the lower layer. The signal strength in the section b1-b2 is higher than that of the surroundings.

Descriptions of the procedure for calculating the incident angle θ based on respective positions of a1, a2, b1, b2, which are obtained from the SEM image, are as follows. As described above, if the incident angle θ is zero (no inclination), the center position of the groove 51 (a1+a2)/2 should align with the center position of the line pattern 52 (b1+b2)/2. However, if the incident angle θ is not zero (with the incident angle of $\theta_x$), the center positions are deviated from each other by $L \cdot \tan \theta$, as described with reference to FIG. 2.

Thus, the following relation holds.

$$(b1+b2)/2-(a1+a2)/2=L \cdot \tan \theta_x \quad \text{Equation 1}$$

When the above equation is solved for θ, the following equation is obtained.

$$\theta_x = \text{ATAN}\left[\{(b1+b2)/2-(a1+a2)/2\}/L\right] \quad \text{Equation 2}$$

While an inclination angle in an X direction is obtained as $\theta_x$ herein, an inclination angle in a Y direction is measured similarly for the pattern on which the groove 51 is formed in the X direction.

[Method for Measuring Overlay Misalignment Amount]

Descriptions will be given of a method for measuring an overlay misalignment amount in the present embodiment with reference to FIG. 6 to FIG. 8. The measurement processing is executed of course after the aforementioned correction of the inclination angle. FIG. 6 illustrates a processing procedure executed in calculation of the overlay misalignment amount.

The control PC 20 receives selection of the wafer 11 and a recipe and selection to execute overlay measurement, through the GUI screen (process 61). The control PC 20 loads the selected wafer 11 to the sample chamber 2 (process 62).

Next, the control PC 20 executes alignment by an optical microscope image and an SEM image (process 63). Subsequently, the control PC 20 controls the XY stage 13 and moves the wafer 11 to an overlay measurement point that is registered in the recipe (process 64).

Subsequently, the image processing board 19 acquires an SEM image in accordance with a predetermined condition that is registered in the recipe (process 65). The image processing board 19 detects a pattern position on the upper layer in the secondary electron image by a signal from the secondary electron detector 9 and a pattern position on the lower layer in the back scattered electron image by a signal from the back scattered electron detector 10, and calculates an overlay misalignment amount from the difference between the pattern positions on the upper layer and the lower layer (process 66). In the calculation, a misalignment amount unique to the incident angle θ of the irradiation electron 32 is subtracted from an apparent overlay misalignment amount between the pattern on the upper layer and the pattern on the lower layer. Descriptions of the calculation method will be given later in detail.

The control PC 20 determines whether calculations of the overlay misalignment amount for all measurement points specified by the recipe are completed (process 67). While an unmeasured measurement point remains (while a negative result is obtained), the control PC 20 moves a next measurement point to the irradiation range of the irradiation electron 32 and executes image acquisition and overlay misalignment amount calculation. When the measurement of all the measurement points is completed (when a positive result is obtained), the control PC 20 unloads the wafer 11 (process 68), and outputs the measurement result of the overlay misalignment amount (process 69).

Figure 7A:
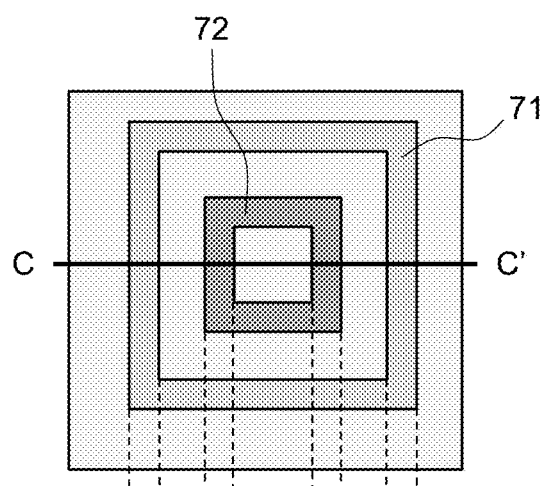
FIGS. 7A and 7B are diagrams of an example of a target pattern for measurement of an overlay misalignment amount.
Figure 7B:
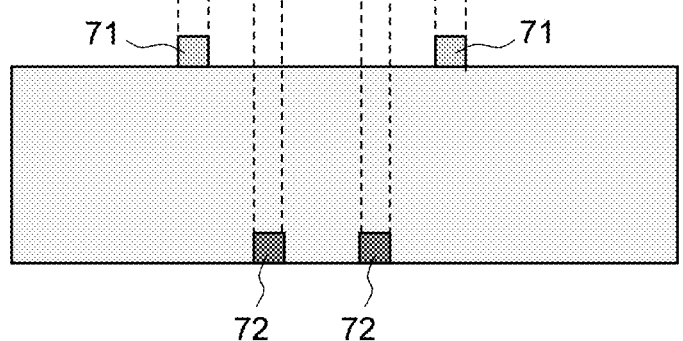

FIG. 7 illustrates a structure example of patterns for measurement of an overlay misalignment amount. FIG. 7(*a*) is a diagram viewed from the incident direction of the irradiation electron 32. FIG. 7(*b*) illustrates a section taken along C-C'. A pattern 71 is formed on a wafer surface. A pattern 72 is formed inside the wafer. The center of the pattern 71 is designed to align with the center of the pattern 72.

FIG. 8 provides an explanation of a specific example of calculation processing in process 66. FIG. 8(*a*) is an image obtained by a detection signal output from the secondary electron detector 9, which has a peak of the detection signal at an edge portion of the pattern 71 formed on the wafer surface. In FIG. 8(*b*), which illustrates a signal strength in the section Ax-Ax', four peaks, $a_{X1}$, $a_{X2}$, $a_{X3}$, $a_{X4}$ corresponding to a pattern edge are seen. If the center position of the pattern 71 in the X direction is $a_{Xc}$, the center position $a_{Xc}$ is given by the following equation.

$$a_{Xc} = (a_{X1}+a_{X2}+a_{X3}+a_{X4})/4 \quad \text{Equation 3}$$

In the same way, if the center position of the pattern 71 in the Y direction is $a_{Yc}$, the e center position $a_{Yc}$ is given by the following equation with use of the four peaks of the signal strength in the section $A_Y$-$A_Y'$ in FIG. 8(*c*).

$$a_{Yc} = (a_{Y1}+a_{Y2}+a_{Y3}+a_{Y4})/4 \quad \text{Equation 4}$$

FIG. 8(*d*) is an image obtained by a detection signal output from the back scattered electron detector 10, in which a signal strength is high at the position of the pattern 72 formed inside the wafer, due to contrast caused by variation of materials. FIG. 8(*e*) illustrates a signal strength in the section $B_X$-$B_X'$, in which $b_{X1}$, $b_{X2}$, $b_{X3}$, $b_{X4}$ indicate a part at which the signal strength changes. In this case, the center position $b_{Xc}$ of the pattern 72 in the X direction is given by the following equation.

$$b_{Xc}=(b_{X1}+b_{X2}+b_{X3}+b_{X4})/4 \quad \text{Equation 5}$$

In the same way, if a center position of the pattern 72 in the Y direction is $b_{Yc}$, the center position $b_{Yc}$ is given by the following equation with four strength change positions in a signal strength of the section $B_Y$-$B_Y'$ in FIG. 8(*f*).

$$b_{Yc}=(b_{Y1}+b_{Y2}+b_{Y3}+b_{Y4})/4 \quad \text{Equation 6}$$

If overlay misalignment amounts in the X direction and in the Y direction are $\Delta x$ and $\Delta y$, respectively, $\Delta x$ and $\Delta y$ are obtained by the following equation.

$$\Delta x = b_{Xc} - a_{Xc} \quad \text{Equation 7}$$

$$\Delta y = b_{Yc} - a_{Yc} \quad \text{Equation 8}$$

If the incident angle $\theta$ of the irradiation electron 32 is adjusted to a level that can ignore the measurement error of an overlay misalignment amount, $\Delta x$ and $\Delta y$ can be used as the measurement result of the overlay misalignment amount. If correction of the misalignment amount is required due to the incident angle $\theta$ of the irradiation electron 32 (if a more accurate result is required), a value that is acquired and held during the correction processing of the incident angle $\theta$ of the irradiation electron 32 is used to correct the misalignment amount. If final incident angles in the X direction and the Y direction after correction of the incident angle are $\theta_x$ and $\theta_y$, respectively, and if a difference in depth between the pattern 71 and the patter 72 is L, the corrected $\Delta x$ and $\Delta y$ are given by the following equations.

$$\Delta x = (b_{Xc} - a_{Xc}) - L \cdot \tan\theta_x \quad \text{Equation 9}$$

$$\Delta y = (b_{Yc} - a_{Yc}) - L \cdot \tan\theta_y \quad \text{Equation 10}$$

In the manufacturing process of a semiconductor, thicknesses of respective layers are monitored accurately. Thus, an accurate value for L can be obtained.

[Summary]

In the present embodiment, a scanning electron microscope is provided with the single electron gun 3, the secondary electron detector 9 and the back scattered electron detector 10. The present embodiment uses a method for calculating an overlay misalignment amount between different layers by acquiring simultaneously a detection signal corresponding to the pattern formed on the upper layer of the measurement point and a detection signal corresponding to the pattern formed on the lower layer of the measurement point. In this way, the present embodiment does not need to provide multiple electron guns, unlike the conventional device, and thus, no adjustment is required to align axes of electron beams with each other. Furthermore, since a detection signal corresponding to the pattern formed on the upper layer and a detection signal corresponding to the pattern formed on the lower layer are acquired simultaneously with the same irradiation electron 32, a high accuracy in position detection is expected. Moreover, the single electron gun 3 allows miniaturization of the device configuration. Furthermore, since the pattern formed on the upper layer is measured with the secondary electron detector 9 and the pattern formed on the lower layer is measured with the back scattered electron detector 10, the patterns formed on the respective layers can be detected highly accurately.

In the present embodiment, correction of the incident angle $\theta$ of the irradiation electron 32 to a value equal to or lower than a prescribed value with the standard sample 12 is followed by the measurement of an overlay misalignment amount. Thus, a unique misalignment amount caused by the incident angle $\theta$ of the irradiation electron 32 can be suppressed within an allowable value, and measurement accuracy of the overlay misalignment amount can be increased. Furthermore, since an overlay misalignment amount is corrected with the unique misalignment amount caused by the incident angle $\theta$ which is acquired in the correction, the measurement accuracy of the overlay misalignment amount can be further increased.

Feedback of the measurement result to a manufacturing process contributes to improvement in yield of a semiconductor device.

In the present embodiment, the incident angle $\theta$ of the irradiation electron 32 is corrected before the measurement of an overlay misalignment amount, and thus, accuracy of the measurement of an overlay misalignment amount, which follows the correction, is guaranteed. However, the incident angle $\theta$ of the irradiation electron 32 may be measured even after the measurement, and an alarm may be generated if $\theta$ varies before and after the measurement, or if the incident angle $\theta$ after the measurement exceeds a prescribed value.

Embodiment 2

Configuration of Device

Figure 9:
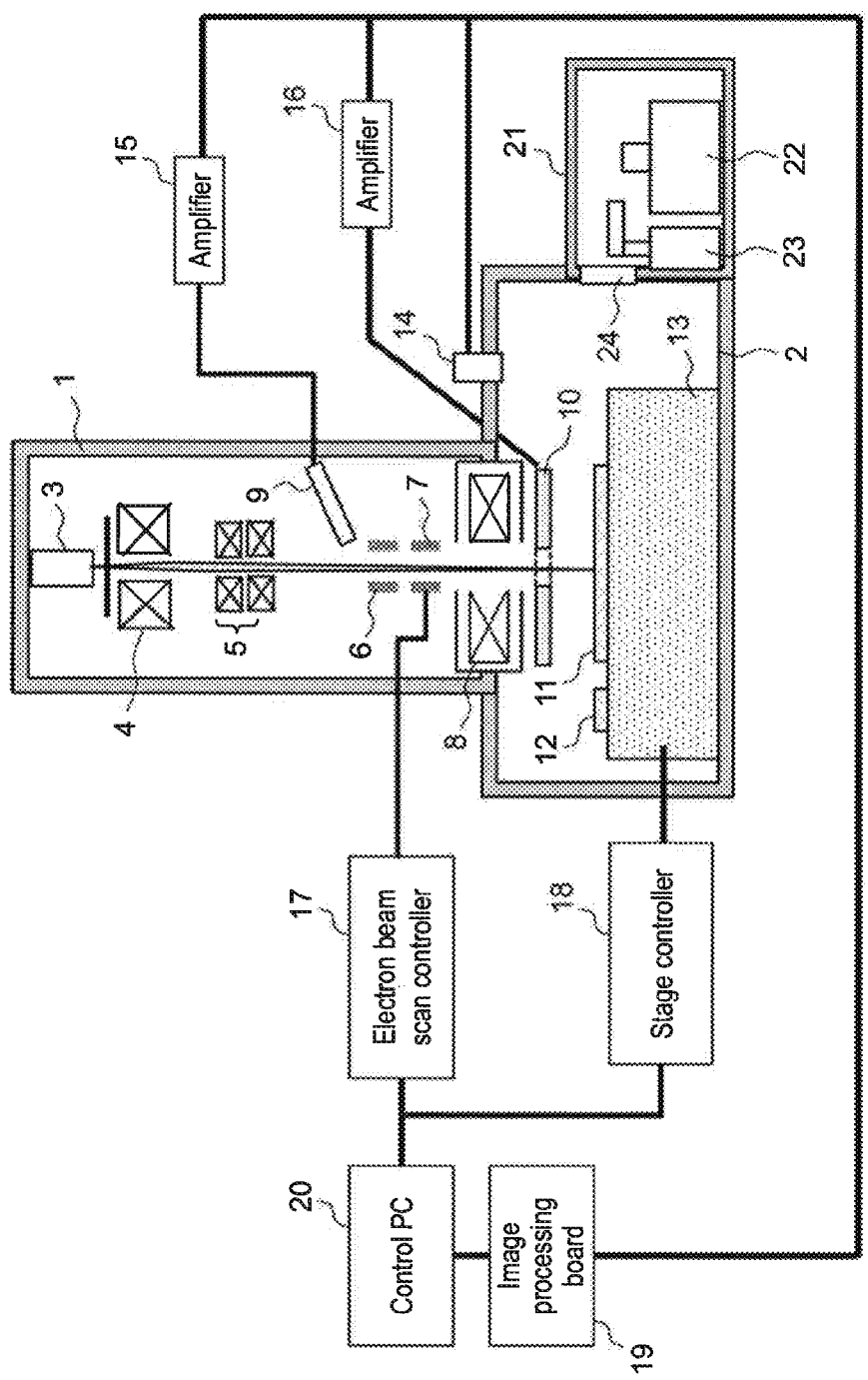
FIG. 9 is a diagram of a schematic configuration example of a scanning electron microscope of Embodiment 2.

Next, FIG. 9 illustrates a configuration of a device of a scanning electron microscope of Embodiment 2. In FIG. 9, a part corresponding to that in FIG. 1 is denoted by the same reference numeral. A device body of the scanning electron microscope of the present embodiment includes a load chamber 21 disposed therein, in addition to the column 1 and the sample chamber 2.

The load chamber 21 is adjacent to the sample chamber 2. An openable and closable valve 24 is disposed between the load chamber 21 and the sample chamber 2. In the load chamber 21, a vacuum aligner 22 and a robot 23 are set. The load chamber 21 also has a non-illustrated vacuum exhaust mechanism.

The robot 23 is a conveyance mechanism that moves the wafer 11 between the XY stage 13 and the vacuum aligner 22. The vacuum aligner 22 is a rotation mechanism that rotates and drives the wafer 11 in a horizontal plane. A mechanism, disclosed by Patent Literature 5 is used for the vacuum aligner 22. The vacuum aligner 22 has, for example, a stage on which the wafer 11 is placed, a mechanism which detects the center position and direction of the wafer 11, a mechanism that rotates and drives the stage, and a mechanism that detects a rotation amount. A rotation angle may be any angle, e.g., 180°, 120°, or 90°. In the following description, a case of rotating the wafer 11 by 180° will be described. Providing the load chamber 21 as in the present embodiment allows the wafer 11 to be kept in a vacuum state as in the sample chamber 2 (that is, without taking out the wafer 11 temporarily to an outside), and allows the wafer 11 to return onto the stage 13 after direction change.

[Method for Measuring Overlay Misalignment Amount]

Figure 10:
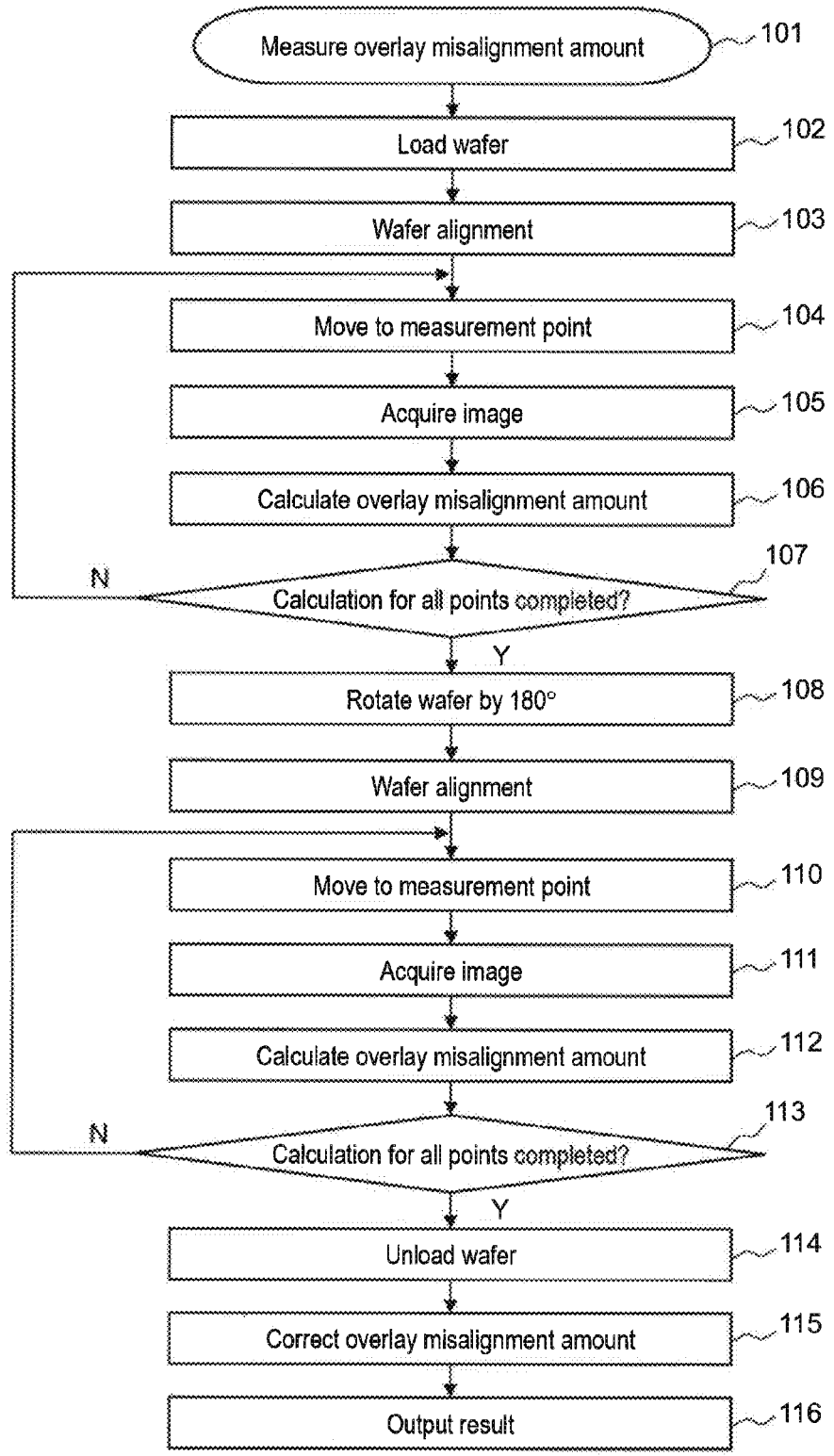
FIG. 10 is a diagram of a procedure for measuring an overlay misalignment amount in Embodiment 2.

The method for measuring an overlay alignment in the present embodiment will be described with reference to FIG. 10.

The control PC 20 receives selection of the wafer 11 and a recipe and selection to execute overlay measurement, through the GUI screen (process 101). The control PC 20 loads the selected wafer 11 to the sample chamber 2 (process 102).

Next, the control PC 20 executes alignment by an optical microscope image and an SEM image (process 103). Subsequently, the control PC 20 controls the XY stage 13 and moves the wafer 11 to an overlay measurement point that is registered in the recipe (process 104).

Subsequently, the image processing board 19 acquires an SEM image in accordance with a predetermined condition that is registered in the recipe (process 105). The SEM image acquired here is also obtained by adding a signal from the secondary electron detector 9 and a signal from the back scattered electron detector 10. The image processing board 19 calculates an overlay misalignment amount with respect to the acquired SEM image (process 106). In the present embodiment, the calculated overlay misalignment amount includes an apparent overlay misalignment amount between the pattern on the upper layer and the pattern on the lower layer (misalignment amount unique to the incident angle $\theta$ of the irradiation electron 32). The correction processing of the incident angle $\theta$ described in Embodiment 1 is basically unnecessary. However, the correction processing may be executed.

The control PC 20 determines whether calculations of the overlay misalignment amount for all measurement points specified by the recipe are completed (process 107). While an unmeasured measurement point remains (while a negative result is obtained), the control PC 20 moves a next measurement point to the irradiation range of the irradiation electron 32 and executes image acquisition and overlay misalignment amount calculation.

When the measurement of all the measurement points is completed (when a positive result is obtained), the control PC 20 moves the wafer 11 to the load chamber 21, and rotates the direction of the wafer 11 by 180° (process 108). Subsequently, the control PC 20 returns the rotated wafer 11 onto the XV stage 13.

Subsequently, the control PC 20 executes alignment by the optical microscope image and the SEM image (process 109). Then, the control PC 20 controls the XY stage 13 and moves the wafer 11 to an overlay measurement point that is registered in the recipe (process 110).

Subsequently, the image processing board 19 acquires an SEM image in accordance with a predetermined condition that is registered in the recipe (process 111). The SEM image acquired here is also obtained by adding a signal from the secondary electron detector 9 and a signal from the back scattered electron detector 10. The image processing board 19 calculates an overlay misalignment amount with respect to the acquired SEM image (process 112). The overlay misalignment amount here also includes an apparent overlay misalignment amount between the pattern on the upper layer and the pattern on the lower layer (misalignment amount unique to the incident angle $\theta$ of the irradiation electron 32).

Subsequently, the control PC 20 determines whether calculations of the overlay misalignment amount for all measurement points specified by the recipe are completed (process 113). When the measurement of all the measurement points is completed (when a positive result is obtained), the control PC 20 unloads the wafer 11 (process 114).

Subsequently, the image processing board 19 or the control PC 20 corrects the measurement result by two overlay misalignment amounts that are measured on a single measurement point with changing the direction (process 115). More specifically, an average value of the two overlay misalignment amounts is calculated. The process 115 may be executed before or at a same time of unload of the wafer 11. Then, the control PC 20 outputs the measurement result of the overlay misalignment amount (process 116).

FIG. 11 provides an explanation that rotation of the direction of the wafer 11 by 180° and two measurements of an overlay misalignment amount from different rotation directions for a single measurement point allow a misalignment amount unique to the incident angle $\theta$ of the irradiation electron 32 to be cancelled.

Figure 11A:
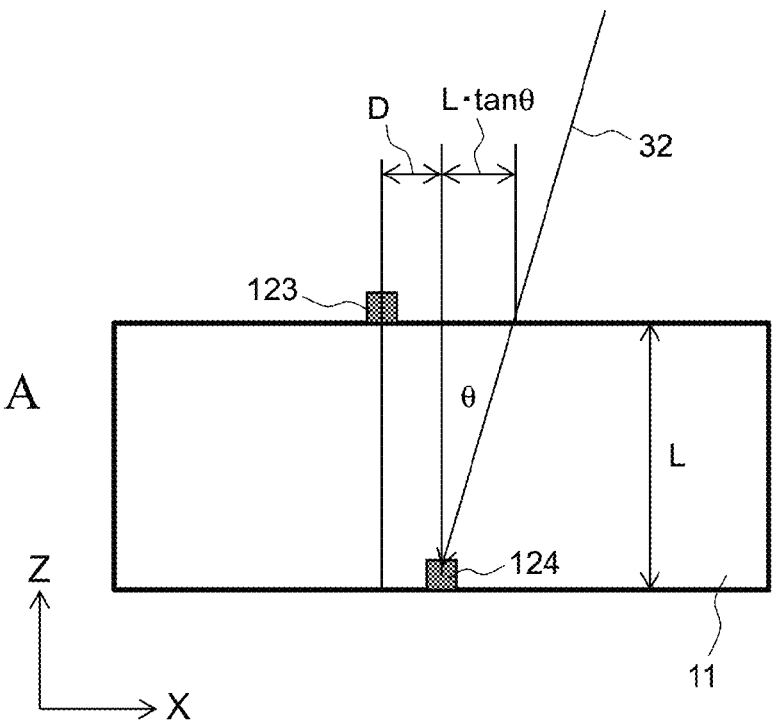
FIGS. 11A and 11B are diagrams explaining a cancelation principle of an overlay misalignment amount in Embodiment 2.
Figure 11B:
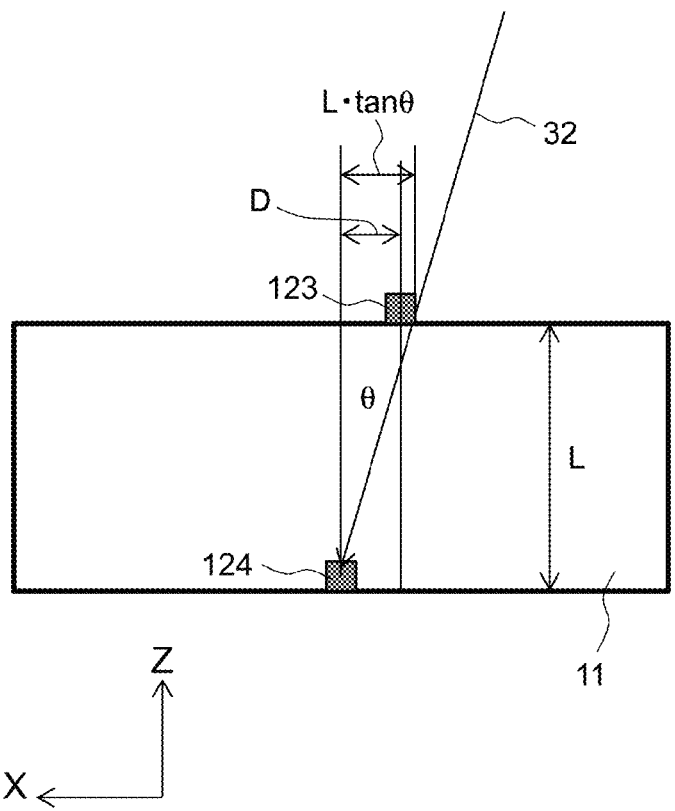

FIG. 11(a) illustrates a state before rotating the wafer 11. FIG. 11(b) illustrates a state after rotating the wafer 11 by 180°. In FIG. 11, a pattern 123 is formed on the upper layer of the wafer 11, while a pattern 124 is formed on the lower layer. The height of the upper layer differs from that of the lower layer by a thickness L. The pattern 123 is deviated from the pattern 124 by a distance D in the X direction. The case where the irradiation electron 32 is incident on the wafer 11 at the incident angle $\theta$ is considered.

In the case of FIG. 11(a), an overlay misalignment amount $\Delta_1$ is obtained by the following equation.

$$\Delta_1 = D + L \cdot \tan\theta \qquad \text{Equation 11.}$$

Specifically, $\Delta_1$ is a value that adds the misalignment amount of $L \cdot \tan\theta$ to D which is to be measured originally.

In contrast, in the case of FIG. 11(b) where the wafer 11 is rotated by 180°, an overlay misalignment amount $\Delta_2$ is obtained by the following equation.

$$\Delta_2 = D - L \cdot \tan\theta \qquad \text{Equation 12}$$

Specifically, $\Delta_2$ is a value that adds the misalignment amount of $-L \cdot \tan\theta$ to D which is to be measured originally.

Then, the average value of $\Delta_1$ and $\Delta_2$ is obtained by the following equation.

$$(\Delta_1 + \Delta_2)/2 = \{(D + L \cdot \tan\theta) + (D - L \cdot \tan\theta)\}/2 = D \qquad \text{Equation 13}$$

The average value by Equation 13 cancels the unique misalignment amount caused by the incident angle $\theta$ of the irradiation electron 32 so that a true overlay misalignment amount D can be calculated accurately.

If the same processing procedure is applied to measurement of an overlay misalignment amount D in the Y direction, a true overlay misalignment amount D can be calculated.

[Summary]

The present embodiment requires rotation of the direction of the wafer 11 by 180° and measurement of two overlay misalignment amounts for a single measurement point. However, preparation or correction of the standard sample 12 for correction of the incident angle $\theta$ of the irradiation electron 32 can be eliminated. As described above, the rotation angle of the wafer 11 may be any angle. For example, the wafer 11 may be rotated by 120° three times to measure an overlay misalignment amount with respect to a single measurement point from three directions and then an average value of the overlay misalignment amounts may be calculated. Furthermore, for example, the wafer 11 may be rotated by 90° four times to measure an overlay misalignment amount with respect to a single measurement point from four directions and then an average value of the overlay misalignment amounts may be calculated. If the wafer 11 is rotated and multiple overlay misalignment amounts for a single measurement point are calculated and averaged in this manner, influence of the incident angle $\theta$ of the irradiation electron 32 can be reduced. Thus, a highly accurate overlay misalignment amount can be calculated.

In the present embodiment, since the load chamber 21 is adjacent to the sample chamber 2, the wafer 11 can be rotated in a vacuum state. As a result, the work time can be significantly reduced, compared to a case where the wafer 11 is taken out from the sample chamber 2 and rotated.

In the present embodiment, the load chamber 21 is provided. However, if the XY stage 13 includes a mechanism to rotate the wafer 11, the load chamber 21 is not needed. In such a case, further miniaturizing of the device configuration is possible.

Other Embodiments

The present invention is not limited to the aforementioned embodiments. The present invention includes various modifications. For example, the electron gun 3 is used in the aforementioned embodiments, however, a charged particle source, e.g., an ion source or the like may be used. That is, the present invention is not limited to a scanning electron microscope, and may use a charged particle beam device, e.g., an ion microscope or the like. The scanning electron microscope of the embodiments is not limited to a length measuring SEM, and may be a review SEM.

The aforementioned embodiments provide detailed descriptions to make the present invention easy to understand. The present invention does not need to include all the described configurations. Part of one of the embodiments can be replaced with a configuration of the other embodiment. A configuration of one of the embodiments can be added to a configuration of the other embodiment. Another configuration can be added to part of configurations of the respective embodiments. Such part of configurations of the respective embodiments can be eliminated or replaced with another configuration.

Part or all of the aforementioned configurations, functions, processing units, processing means and the like may be achieved by, e.g., an integrated circuit or other hardware. The aforementioned configurations, functions and the like may be achieved by a processor interpreting and executing respective programs to achieve the functions. That is, the aforementioned configurations, functions and the like may be achieved by software. Information such as a program, a table or a file to achieve the functions may be stored in a storage device such as a memory, a hard disk or an SSD (solid state drive), or a storage medium such as an IC card, an SD card, or a DVD.

A control line or an information line is a line which is considered to be required for the descriptions. Not all control lines or information lines necessary for a product are illustrated. It may be considered that most of all the configurations are actually connected with each other.

REFERENCE SIGNS LIST

1 . . . Column, 2 . . . Sample chamber, 3 . . . Electron gun, 4 . . . Condenser lens, 5 . . . Aligner, 6 . . . ExB filter, 7 . . . Deflector, 8 . . . Objective lens, 9 . . . Secondary electron detector, 10 . . . Back scattered electron detector, 11 . . . Wafer, 12 . . . Standard sample, 13 . . . XY stage, 14 . . . Optical microscope, 15, 16 . . . Amplifier, 17 . . . Electron beam scan controller, 18 . . . Stage controller, 19 . . . Image processing board, 20 . . . Control PC, 21 . . . Load chamber, 22 . . . Vacuum aligner, 23 . . . Robot, 24 . . . Valve, 33, 34, 71, 72, 123, 124 . . . Pattern, 51 . . . Groove, 52 . . . Line pattern.

The invention claimed is:

1. A charged particle beam device comprising:
a charged particle beam source that irradiates a sample with a charged particle beam under one irradiation condition;
a first detector that detects a signal generated from a first pattern formed on a first layer in a measurement region;
a second detector that detects a signal generated from a second pattern formed on a second layer in the measurement region at a same time as the first detector; and
an image processing unit that measures an overlay misalignment amount between the first pattern and the second pattern based on a first detection signal and a second detection signal output by the first detector and the second detector, respectively.

2. The charged particle beam device according to claim 1, further comprising an incident angle adjustment unit that allows a standard sample to be irradiated with the charged particle beam before measurement of the overlay misalignment amount and corrects an incident angle of a charged particle beam, the standard sample having patterns at a same position on an upper layer and a lower layer or having a known positional relationship between the patterns of the upper layer and the lower layer.

3. The charged particle beam device according to claim 2, wherein the image processing unit corrects the overlay misalignment amount measured primarily, based on an incident angle measured in correction of the incident angle of the charged particle beam.

4. The charged particle beam device according to claim 3, wherein the irradiation condition is set to allow the first and second detectors to detect respective signals from the corresponding layers independently and simultaneously.

5. The charged particle beam device according to claim 4, wherein an overlay misalignment amount between the first pattern and the second pattern is calculated from
a position of the first pattern in the first layer, the position of the first pattern obtained by an image of the signal output from the first detector, and
a position of the second pattern in the second layer, the position of the second pattern obtained by an image of the signal output from the second detector.

6. The charged particle beam device according to claim 4, wherein one of the first and second detectors is a secondary electron detector and the other is a back scattered electron detector.

7. The charged particle beam device according to claim 6, wherein a recipe used in measurement of the overlay misalignment amount is capable of being selectively input through a GUI.

8. The charged particle beam device according to claim 1, further comprising a mechanical unit being capable of rotating a direction of a sample in an incident plane of the charged particle beam, the sample being a target fir measurement of the overlay misalignment amount, and wherein
the image processing unit measures an overlay misalignment amount between the first and second patterns for a single measurement point from multiple rotation directions, and an average value of multiple measurement results is made to be an overlay misalignment amount between the first and second patterns.

9. The charged particle beam device according to claim 8, wherein the image processing unit measures an overlay misalignment amount between the first and second patterns with respect to two rotation directions rotation angles of which are different from each other by 180°, and makes an average value of the two measurement results to be an overlay misalignment amount between the first and second patterns.

10. The charged particle beam device according to claim 9, wherein the sample is rotated on a stage capable of rotating by 180°.

11. The charged particle beam device according to claim 8, wherein the rotatable mechanical unit is disposed in a chamber connected to a sample chamber via a valve in an openable or closable manner, a sample to be irradiated with the charged particle beam being disposed in the sample chamber.

12. The charged particle beam device according to claim 8, wherein the rotatable mechanical unit rotates and drives a stage, a sample to be irradiated with the charged particle beam being disposed on the stage.

13. An overlay misalignment measurement method comprising:
  irradiating a sample with a charged particle beam from a charged particle beam source under one irradiation condition;
  detecting a signal generated from a first pattern formed on a first layer in a measurement region by a first detector;
  detecting a signal generated from a second pattern formed on a second layer in the measurement region by a second detector, at a same time as the first detector; and
  measuring an overlay misalignment amount between the first and second patterns based on a first detection signal and a second detection signal output from the first detector and the second detector, respectively.

14. The overlay misalignment measurement method according to claim 13, further comprising, before the measuring the overlay misalignment amount, irradiating a standard sample with the charged particle beam and correcting an incident angle of a charged particle beam, the standard sample having patterns at a same position on an upper layer and a lower layer or having a known positional relationship between the patterns on the upper layer and the lower layer.

15. The overlay misalignment measurement method according to claim 14, wherein the overlay misalignment amount measured primarily is corrected based on the incident angle measured in the correction of the incident angle of the charged particle beam.

16. The overlay misalignment measurement method according to claim 13, wherein an overlay misalignment measurement amount between the first and second patterns is measured for a single measurement point from multiple rotation directions, and an average value of multiple measurement results is made to be an overlay misalignment amount between the first and second patterns.

\* \* \* \* \*